United States Patent
Lothian et al.

[11] Patent Number: 5,981,319
[45] Date of Patent: Nov. 9, 1999

[54] METHOD OF FORMING A T-SHAPED GATE

[75] Inventors: James Robert Lothian, Bethlehem, Pa.; Fan Ren, Warren, N.J.

[73] Assignee: Lucent Technologies Inc., Murray Hill, N.J.

[21] Appl. No.: 08/935,121

[22] Filed: Sep. 22, 1997

[51] Int. Cl.⁶ .................................................. H01L 21/338
[52] U.S. Cl. .......................... 438/167; 438/571; 438/572; 438/576; 438/579
[58] Field of Search .................................... 438/167, 576, 438/579, 571, 572

[56] References Cited

U.S. PATENT DOCUMENTS

| | | |
|---|---|---|
| 5,406,099 | 4/1995 | Hiramatsu . |
| 5,583,063 | 12/1996 | Samoto . |
| 5,693,548 | 12/1997 | Lee et al. . |
| 5,766,967 | 6/1998 | Lai et al. . |
| 5,776,805 | 7/1998 | Kim . |
| 5,858,824 | 1/1999 | Saitoh . |

FOREIGN PATENT DOCUMENTS 2-266535  10/1990  Japan .

OTHER PUBLICATIONS 0.25–micron pseudomorphic HEMT's processed with damage–free dry–etch gate recess technology, IEEE Transactions on Electron Devices, vol. 39, No. 12, pp. 2701–2706, Dec. 1992.

*Primary Examiner*—Richard Booth
*Assistant Examiner*—Jonathan Hack

[57] ABSTRACT

The specification describes methods for making T-shaped metal gates for Schottky gate devices such as MESFETs and HEMTs. The method uses a bi-level photoresist technique to create a T-shaped feature for the gate structure. The metal gate is evaporated into the photoresist T-shaped feature and a lift-off process is used to remove unwanted metal. The photoresist is the dissolved away leaving the T-shaped gate. An important aspect of the process is the use of a plasma treatment of the first patterned resist level to harden it so that it is unaffected by the subsequent deposition and patterning of the second level resist.

7 Claims, 5 Drawing Sheets

METHOD OF FORMING A T-SHAPED GATE

FIELD OF THE INVENTION

This invention relates to methods for the fabrication of field effect transistors with T-shaped gates. It is particularly applicable to Metal-Semiconductor Field Effect Transistor devices (MESFETs) and High Electron Mobility Transistor devices (HEMTs).

BACKGROUND OF THE INVENTION

As the feature size in integrated circuits continues to shrink the gate size for transistors must be correspondingly reduced. In state of the art III-V transistor devices the gate size has reached the point where gate resistance due to the small gate dimensions is a performance limiting factor. To overcome this limitation T-shaped gates and Y-shaped gates have been proposed. See e.g. M. H. Somerville et al "A model for Tunneling-Limited Breakdown in High Power HEMTs", IEEE IEDM, pp. 35–38 (1996); F. Ren et aL, "Y-gate submicron gate length GaAs metal-semiconductor field effect transistors", J. Vac. Sci. Technol. B 11(5), September/October 1993; A. Mahajan et al, "Monolithic Integration of InAlAs/InGaAs/InP Enhancement- and Depletion-Mode High Electron Mobility Transistors, IEEE IEDM, pp. 51–53, (1996). The T-shaped electrodes for these devices are produced by exposing T-shaped patterns in the resist at the gate location, developing the resist to form T-shaped openings, and evaporating metal into the T-shaped openings. A lift-off process is used to remove excess metal on the resist surface between T-shaped features. The e-beam approach has been successful but the e-beam writing step to form the T-shaped features is slow due to that characteristic raster scan of e-beam lithography, and very expensive. A better approach from the standpoint of throughput would be to use the blanket exposure characteristic of photolithographic processes but to date a photolithographic process for forming a vertically oriented T-shaped feature has not been available in the context of this technology.

STATEMENT OF THE INVENTION

We have developed a photolithographic process for forming T-shaped Schottky gate structures for use in III-V field effect transistor devices. A thick bi-level photoresist layer is used to define T-shaped features, and gate contact metal is deposited in the T-shaped features to form the gate contact structure. The first level resist is patterned and then hardened to withstand the photolithographic patterning step for the second level. The feature in the second level is made to be larger than the first formed feature, thereby producing a structure that is larger at the top than at the base, i.e. a T-shaped structure.

DETAILED DESCRIPTION

Figure 1:
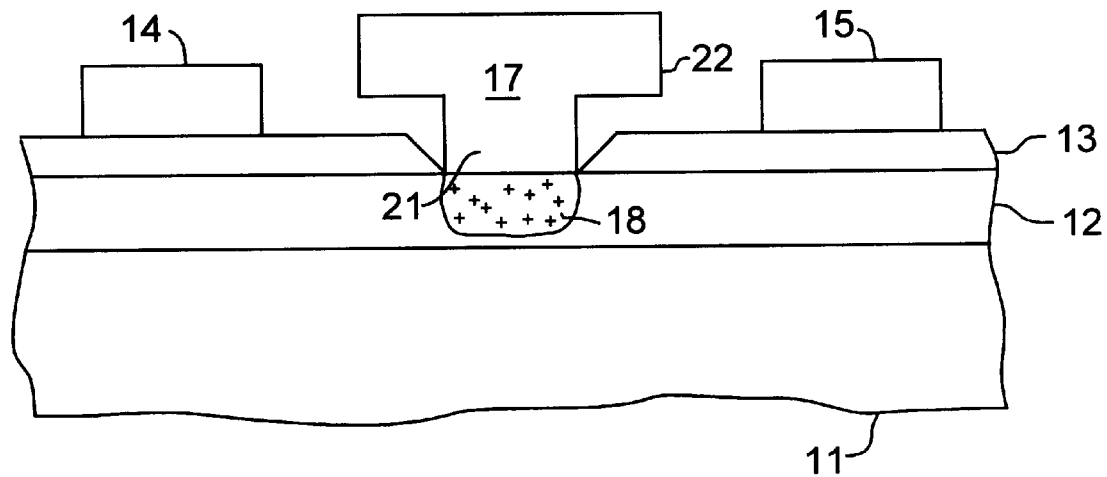
FIG. 1 is a schematic representation of a recessed gate MESFET device with a T-shaped Schottky gate that may be fabricated in accordance with the invention.

Referring to FIG. 1, a MESFET device is shown with substrate 11, typically semi-insulating GaAs, and active layer 12, which is implanted with n-silicon n-type carriers. The cap layer 13 for the source/drain contacts is silicon implanted $n^+$. The source and drain contacts 14 and 15 are conventional metal materials such as Ti/Pd/Au, Ti/Pt/Au, Al/Ti, Au/Ge. The gate is recessed by wet etching a window in layer 13 so that the gate is situated on the active layer 12. MESFET devices are typically depletion mode devices with Schottky gates which in contrast with Si MOS transistors are "normally on" devices. The Schottky gate for the MESFET device in FIG. 1 is shown at 17, and is made of a conventional contact metal. When reverse biased, n-type carriers are depleted from depletion region 18 beneath the Schottky gate leaving a p-region that pinches off current flow between the source and drain.

The gate 17 is referred to as T-shaped but is not to be confused with gate configurations, known in the art, that are T-shaped in plan view. The gate configuration in FIG. 1, and which describes the objective of the invention, is a vertical T-shape. It can be defined as having a vertical base 21 and a "cross" 22. The shape of the gate in a plan view may be square but is conventionally rectangular in shape with the width w of the gate extending into the plane of the figure and typically terminating in a contact pad (not shown) outside the active region of the device.

Figure 2:
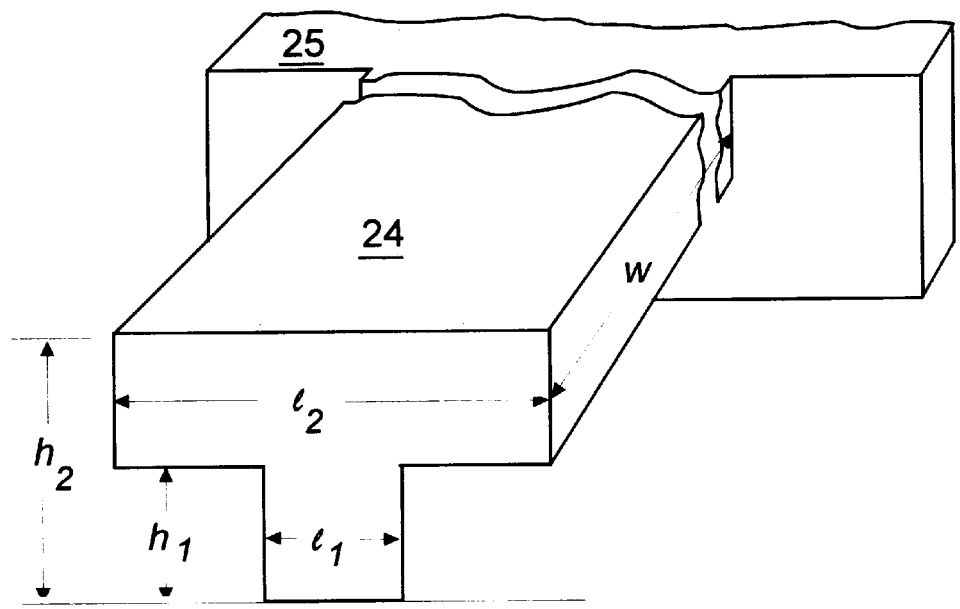
FIG. 2 is a schematic view of a T-shaped gate structure describing the relevant dimensions discussed in this description.

Enhancement of the gate conductivity is a function of the increased cross section between the extremities of the gate along the conduction path. The important gate dimensions are shown in FIG. 2. The objective in these devices is to minimize the gate length l which is the device parameter controlling the frequency response of the transistor. When the gate length l is reduced to shrink the overall device size the gate resistance along the gate width w increases proportionately. The relevant portion of the conduction path, i.e. the reduced dimension, extends mainly over the active region from the free end of gate 24 to the gate runner or the contact pad shown generally at 25. The contact pad typically is at a different level, i.e. on the field oxide but the levels are omitted for simplicity. If the normal gate cross section is $l_1 \times h_1$, the enhanced cross section is $(h_2 \times l_2) - h_1(l_2 - l_1)$. For example, if $h_2 = 2 h_1$ and $l_2 = 3l_1$, i.e. the approximate geometry shown, then the gate conductance enhancement factor is 3. The gate conductivity is considered enhanced in the context of the invention if the conductance added by the cross of the T-shaped gate contributes an increase of more than 50% to the standard rectangular or square cross sectioned gate. Expressed in terms of the dimensions shown in FIG. 2:

$$(h_2 \times l_2) - h_1(l_2 - l_1) > 1.5(l_1 \times h_1)$$

The above expression assumes that the gate height is increased over the standard height. In a more typical case, the dimensions $l_1$ and $h_2$ are fixed by the device design and the conventional rectangular gate would have the maximum allowed height, and therefore an effective cross section of $h_2 \times l_1$. In this case the enhancement is $(l_2 - l_1) \times (h_2 - h_1)$. An enhancement of 50% requires:

$$(l_2 - l_1) \times (h_2 - h_1) > 0.5(l_1 \times h_2)$$

Figure 3:
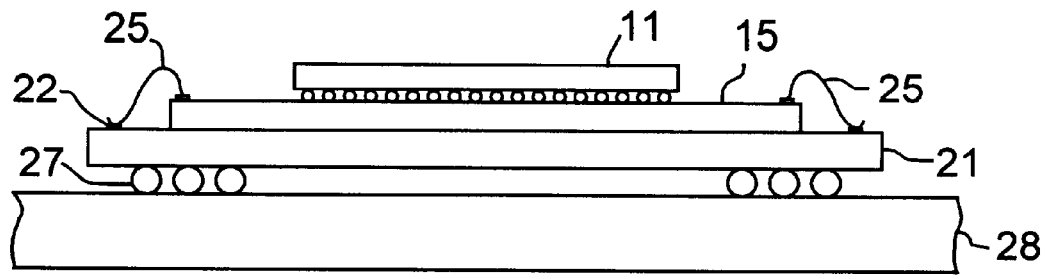
FIG. 3 is a plot of the relevant dimensions shown in FIG. 2 vs. the enhancement factor in gate conductivity.

The two factors that contribute to the enhancement are $h_2/h_1$ and $l_2/l_1$. Both must be greater than unity in a T-shaped structure. The variation of the enhancement factor with these ratios can be seen in FIG. 3 where the ratio $h_2/h_1$ for several values of $l_2/l_1$ is plotted vs. enhancement in percent. It is evident that increasing $h_2/h_1$ gives relatively diminishing returns when $l_2/l_1$ is low, while increasing the length of the cross of the "T", i.e. increasing $l_2/l_1$, is more effective. To obtain an enhancement factor of greater than 50% $l_2/l_1$ should be nearly two or greater.

Figure 4:
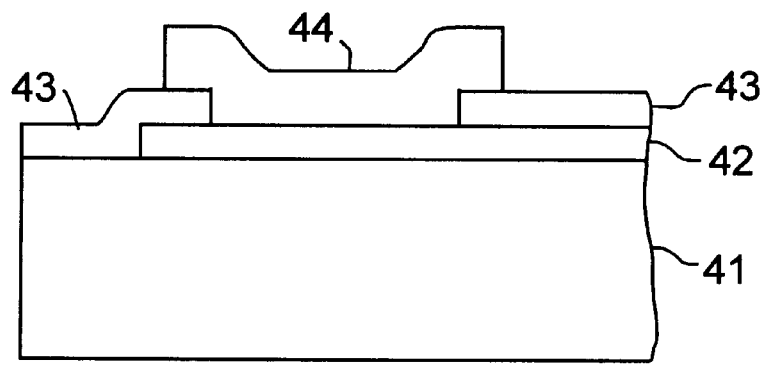
FIG. 4 is a schematic representation of a HEMT device with a T-shaped gate that may be fabricated in accordance with the invention.

Other Schottky gate devices can also take advantage of the enhanced conductivity of T-shaped gates. For example, a HEMT device is shown in FIG. 4. These devices are similar in appearance to the MESFET of FIG. 1 but are more complex in the internal structure and are designed for lower noise, higher frequency performance, and in special structures, higher power. The source and drain contacts 31 and 32 are typically formed on an $n^+$ GaAs layer 33 but the Schottky gate in this structure contacts a heterostructure layer 34, e.g. AlGaAs, under contact layer 33. The active layer 34 and the depletion region 37 are otherwise similar to corresponding elements in the MESFET. Layer 38 is a very thin spacer layer of e.g. undoped AlGaAs, and layer 39 is a buffer layer of undoped GaAs. The substrate 41 may be semi-insulating GaAs. The T-shaped Schottky gate structure is shown at 42 and is essentially the same as in the MESFET device of FIG. 1.

Figure 5:
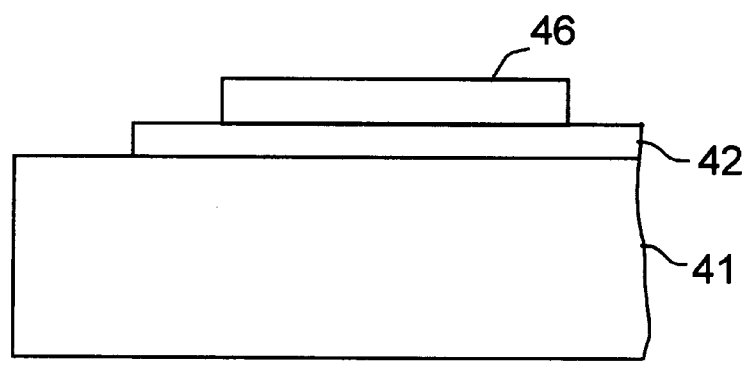
FIGS. 5–13 are representations of process steps used for forming T-shaped gates in accordance with the invention
Figure 5:
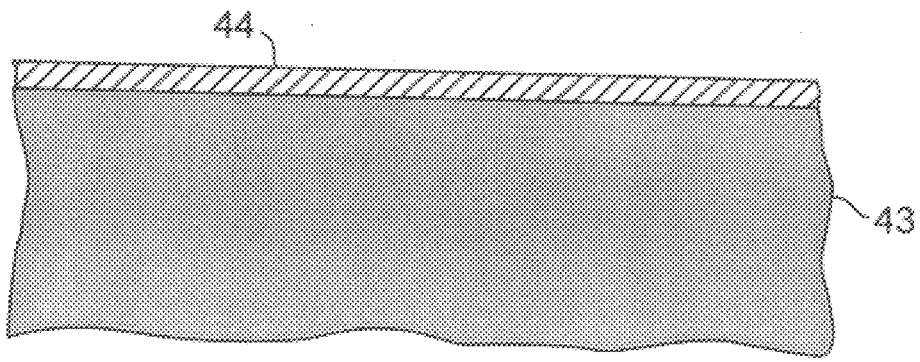
Figure 6:
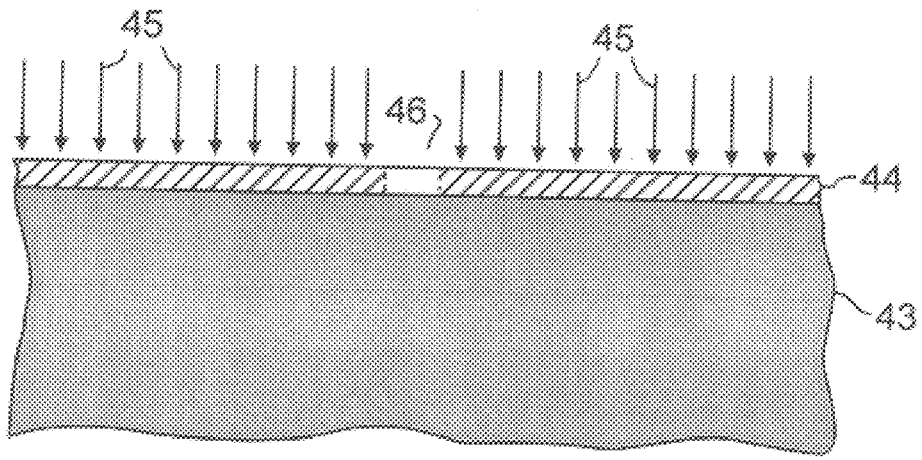
Figure 7:
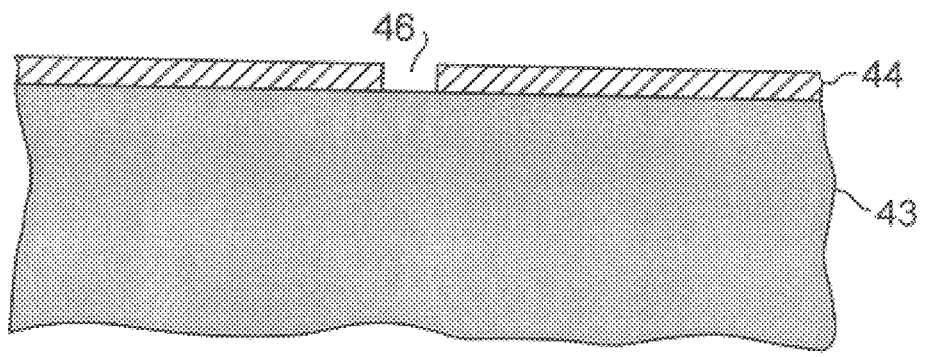

The technique for fabricating the T-shaped gate structures according to the invention will be described in conjunction with FIGS. 5–13. For simplicity in describing the processing the substrate and the functional layers in the substrate will be omitted, the assumption being that these device features are complete at the point in the process where gate fabrication commences. The region of the device shown in FIGS. 5–13 is the substrate surface between the source and drain electrodes the length of which is exaggerated for illustration. Referring to FIG. 5 the substrate 43 is coated with a first level of photoresist 44. The choice of photoresist is not critical and can be any conventional resist material, either positive or negative. In the work described here Shipley 1805 photoresist was spun on the wafer at 3000 rpm for 30 seconds to produce a photoresist layer of 0.5 $\mu$m in thickness, and the layer was prebaked on a hotplate at 110° C. for 60 seconds. The thickness $t_1$ of the first level of photoresist corresponds to dimension $h_1$ of FIG. 2, and is preferably in the range 0.2–2.0 $\mu$m. The photoresist layer 44 is exposed to actinic radiation 45 through a photomask with feature 46 using standard practice as shown in FIG. 6. For the Shipley photoresist mentioned above exposure using a Nikon stepper at 436 nm wavelength for 750 milliseconds is effective. The length and width of photomask feature 46 correspond to the length and width of the base of the T-shaped gate. The pattern can then be developed for 20 seconds using Shipley 321 developer, and then rinsed in D.I. water for 30 seconds. After developing the first level of photoresist window 46 remains as shown in FIG. 7.

Figure 8:
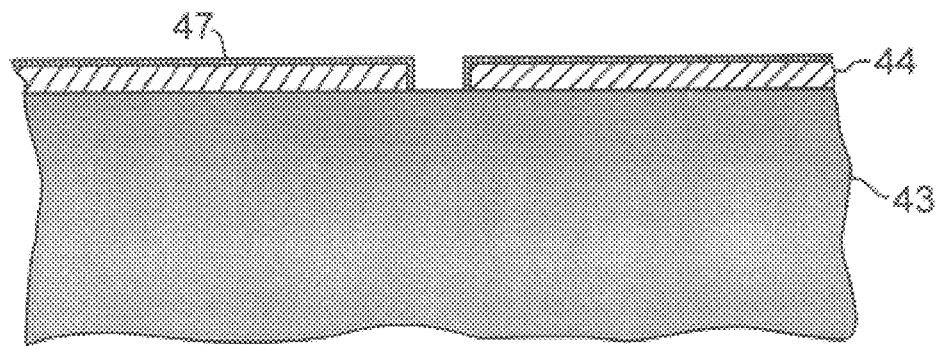

The next step is to harden the surface of the first level photoresist so that it can withstand independent patterning of the second level. This is done by exposure to a plasma which, as shown in FIG. 8, creates a surface layer 47 on the first level photoresist which is durable and is insensitive to subsequent lithographic processing. The plasma treatment can create this surface layer without excessive damage to the integrity of the underlying photoresist. It also proceeds at a relatively low temperature, i.e. 50–100° C. A recommended apparatus for the plasma treatment is an electron cyclotron resonance system (2.45 GHz) and a recommended plasma gas is nitrogen. Other plasma gases such as argon, xenon, helium, oxygen, etc. may also give acceptable results. The preferred gas is an inert gas. Suitable flow rate for nitrogen in the ECR reactor is 2–100 sccm and a suitable power level is 20–500 W. Treatment time can vary e.g. between 0.5–5 minutes. Appropriate plasma processing conditions are highly dependent on the type of plasma reactor used. However plasma treatments are well developed and well understood and the details of the plasma treatment required to render the first level photoresist insensitive to further actinic processing are within the skill of the art. For the purpose of defining this invention the result of the plasma treatment of the first level photoresist is described as rendering the layer lithographically passive.

Figure 9:
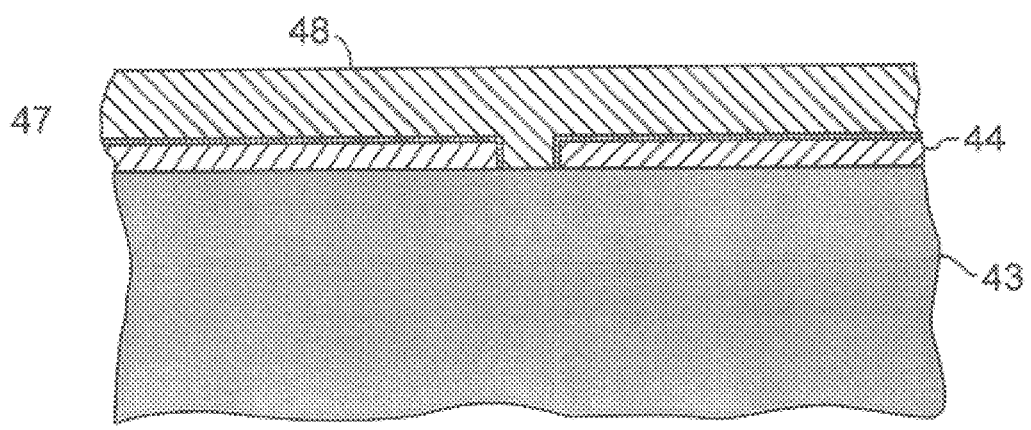
Figure 10:
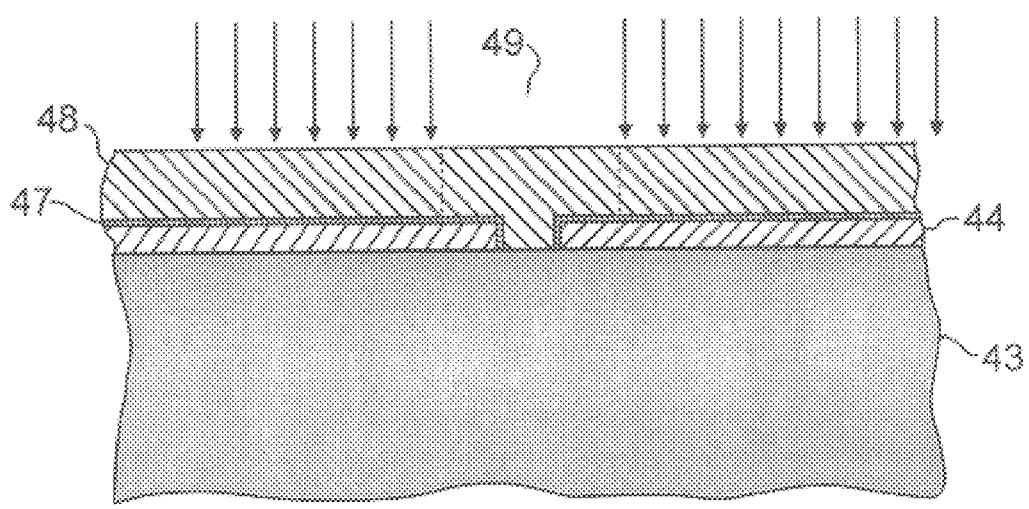

With reference to FIG. 9, the next step in the process is to deposit the second level photoresist 48. The second level is then patterned as shown in FIG. 10. The same procedure can be used as in forming the first photoresist layer except that the mask for the second layer has a larger feature 49 which corresponds to $l_2$ in FIG. 2. The thickness $t_2$ of the second level photoresist layer 48 corresponds to dimension $h_2$ of FIG. 2 with an excess height added to accommodate the liftoff process as will be described below. The thickness $t_2$ will typically be in the range 0.3–3.0 $\mu$m. In our work Shipley 1818 was used for the second level photoresist, and was spun at 3000 rpm for 30 seconds giving a photoresist layer thickness of 1.8 $\mu$m. The layer was prebaked on a hotplate at 110° C. for 60 seconds. The exposure time for the Nikon stepper to expose to the bottom of the second photoresist level was 1200 milliseconds. The second level photoresist was developed for 20 seconds in Shipley 321 developer and rinsed in D.I. water for 30 seconds. The pattern in the first level photoresist remained intact after patterning the second level.

Figure 11:
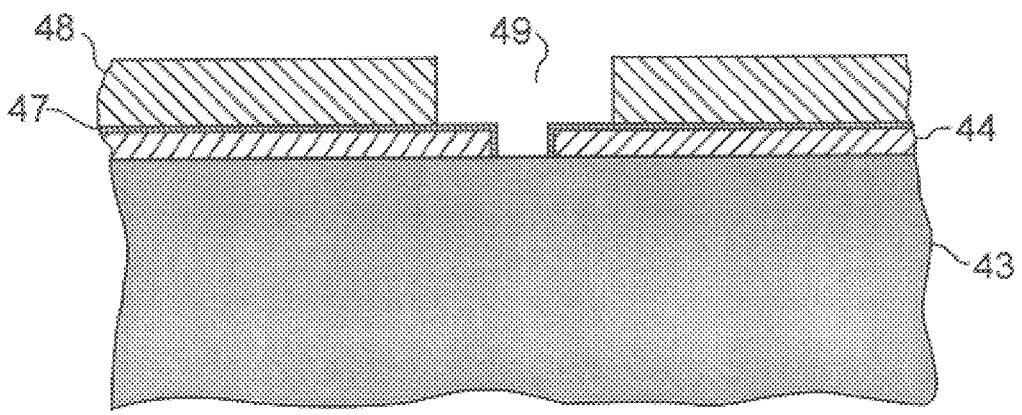
Figure 12:
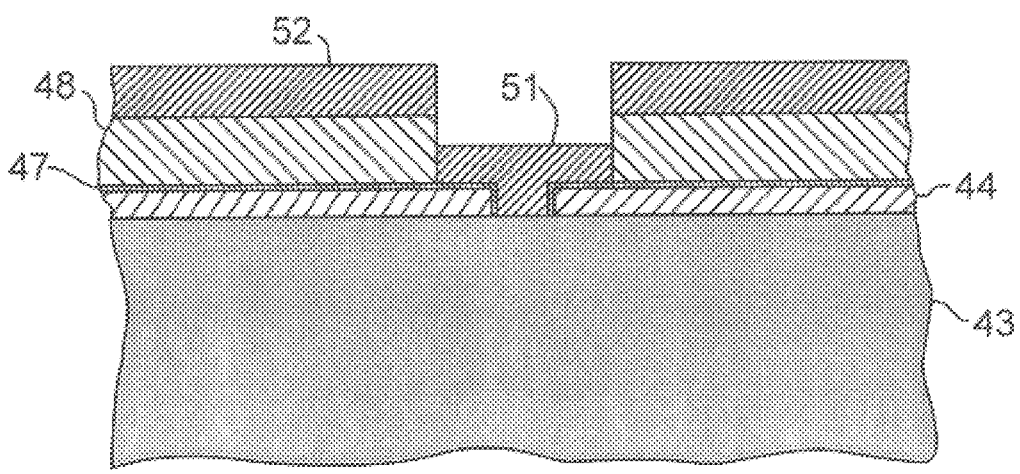

The resulting structure, shown in FIG. 11, is then ready for metallization to form the T-shaped gate. The deposition technique used to deposit the metal, and the composition of the metal are subject to a variety of choices known to those in the art. Evaporation is preferred because it is relatively directional, and therefore is well suited for lift-off processes. Sputtering may also be used. Conformal coating processes such as Chemical Vapor Deposition (CVD), Molecular Beam Epitaxy (MBE) and Atomic Layer Deposition (ALD), are less likely to be effective but ways may be devised by those skilled in the art to adapt these techniques to the process described. In the specific example described here, the preferred deposition technique is evaporation using an e-beam evaporation process. Prior to evaporation the substrate was exposed to a pre-deposit cleaning operation for 3 minutes in an oxygen plasma at 50 watts and 1 torr, followed by a 20:1 HCl:$H_2O$ rinse for 30 seconds. The surface was blow dried with nitrogen for 30 seconds. A suitable metallization for most applications, which is well established in this technology, is 250 Angstroms titanium, 500 Angstroms platinum, and 8000 Angstroms gold. After evaporation of the metal the structure appears as in FIG. 12 with the metallization shown at 51 in the gate region and 52 on the surface of the second level resist. A vertical separation between these metal bodies is intentionally created to facilitate the lift-off process as is well known. In the process described the excess vertical gap between the top surface of the evaporated metal and the top surface of the second level photoresist was approximately 1.4 $\mu$m. An acceptable difference between the thickness of the metal layer ($h_1+h_2$) and the combined thickness, $t_1+t_2$, of the bi-level resist is at least 30%, i.e. $t_1+t_2=1.3(h_1+h_2)$, and preferably at least 100%, i.e. $t_1+t_2=2(h_1+h_2)$.

Figure 13:
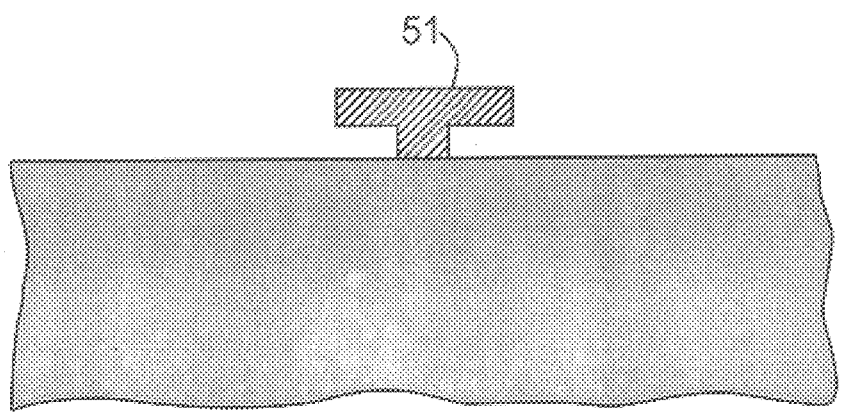

The two levels of resist 42 and 46, carrying the surface layer of unwanted metal 52 are then dissolved in a solvent such as acetone, leaving the final structure as shown in FIG. 13.

Various additional modifications of this invention will occur to those skilled in the art. All deviations from the specific teachings of this specification that basically rely on the principles and their equivalents through which the art has been advanced are properly considered within the scope of the invention as described and claimed.

We claim:

1. A method for the manufacture of a Schottky gate transistor comprising the steps of:

forming a source and drain in a III-V semiconductor substrate, and forming a Schottky gate on the surface of said III-V semiconductor between said source and drain the invention characterized in that said Schottky gate is formed by the steps comprising:

a. depositing a first level of photoresist on the surface of said substrate, said first level of photoresist having a thickness $t_1$, b. lithographically forming an opening in said first level of photoresist, said opening having a rectangular shape with width $w_1$, and length $l_1$, with the length dimension extending along the direction separating the source and drain, c. exposing said first level of photoresist to a plasma to form a surface layer on said first level of photoresist to harden said surface layer and render it lithographically passive, d. depositing a second level of photoresist on said first level of photoresist, said second level of photoresist having a thickness $t_2$, e. lithographically forming an opening in said second level of photoresist, said opening coinciding with said opening in said first level of photoresist and having a rectangular shape with width $w_2$ and length $l_2$, and further where length $l_2$ is greater than length $l_1$, f. depositing a metal layer to fill said first opening and to fill a portion of said second opening, said metal layer having a thickness $h_1+h_2$, where $h_1$ is essentially equal to $t_1$ and $h_2$ is substantially less than $t_2$, g. and dissolving away said first and second level of photoresist leaving a T-shaped Schottky gate.

2. The method of claim 1 wherein said Schottky gate transistor is a MESFET.

3. The method of claim 1 wherein said Schottky gate transistor is a HEMT.

4. The method of claim 1 in which $l_2$ is at least twice $l_1$.

5. The method of claim 1 wherein the dimensions $l_1, l_2, h_1$ and $h_2$ are related by:

$$(l_2-l_1) \times (h_2-h_1) > 0.5(l_1 \times h_2).$$

6. The method of claim 5 wherein $w_1$ is approximately equal to $w_2$.

7. A method for the manufacture of a Schottky gate transistor comprising the steps of:

forming a source and drain in a III-V semiconductor substrate, and forming a Schottky gate on the surface of said III-V semiconductor substrate between said source and drain, the invention characterized in that said Schottky gate is T-shaped with the base of the T having height $h_1$ and the cross of the T having height $h_2$ said T-shaped gate being formed by the steps comprising:

a. depositing a first level of photoresist on the surface of said substrate, said first level of photoresist having a thickness $t_1$ in the range 0.2–2.0 $\mu$m, said thickness $t_1$ being equal to $h_1$, b. photolithographically forming an opening in said first level of photoresist, said opening having a rectangular shape with width $w_1$ and length $l_1$, with the length dimension extending along the direction separating the source and drain, c. placing said substrate in an electron cyclotron resonance plasma reactor and exposing said first level of photoresist to an inert gas plasma at a temperature below 100° C. to form a surface layer on said first level of photoresist to harden said surface layer and render it photolithographically passive, d. depositing a second level of photoresist on said first level of photoresist, said second level of photoresist having a thickness $t_2$ in the range 0.3–3.0 $\mu$m, said thickness $t_2$ being substantially greater than $h_2$, e. photolithographically forming an opening in said second level of photoresist, said opening coinciding with said opening in said first level of photoresist and having a rectangular shape with width $w_2$ and length $l_2$, and further where length $l_2$ is at least twice length $l_1$, f. depositing a metal layer by evaporating metal to fill said first opening and to fill a portion of said second opening, said metal layer having a thickness $h_1+h_2$, where $t_1+t_2$ is at least 2 times $h_1+h_2$, g. and dissolving away said first and second level of photoresist leaving a T-shaped Schottky gate.

* * * * *